(12) United States Patent  (10) Patent No.: US 9,158,611 B2
Chung et al.  (45) Date of Patent: Oct. 13, 2015

(54) TELECOMMUNICATIONS METHODS FOR INCREASING RELIABILITY OF EARLY TERMINATION OF TRANSMISSION

(71) Applicant: MEDIATEK INC., Hsin-Chu (TW)

(72) Inventors: Pei-Shiun Chung, New Taipei (TW); Xiu-Sheng Li, Hsinchu (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 230 days.

(21) Appl. No.: 13/798,158

(22) Filed: Mar. 13, 2013

(65) Prior Publication Data

US 2013/0326319 A1  Dec. 5, 2013

Related U.S. Application Data

(60) Provisional application No. 61/653,627, filed on May 31, 2012.

(51) Int. Cl.
  *H03M 13/00* (2006.01)
  *G06F 11/07* (2006.01)
  *H03M 13/09* (2006.01)
  *H04L 1/18* (2006.01)

(52) U.S. Cl.
  CPC ........... *G06F 11/0751* (2013.01); *H03M 13/09* (2013.01); *H04L 1/1825* (2013.01); *H04L 1/1829* (2013.01); *H04L 1/1864* (2013.01)

(58) Field of Classification Search
  CPC ... H03M 13/09; H04L 1/1825; H04L 1/1829; H04L 1/1864
  USPC .................................. 714/18, 748–749, 758
  See application file for complete search history.

(56) References Cited

U.S. PATENT DOCUMENTS 8,726,117 B2 *  5/2014  Kishigami et al. ............ 714/748
2009/0013232 A1 *  1/2009  Wan et al. ..................... 714/748

* cited by examiner

*Primary Examiner* — Shelly A Chase
(74) *Attorney, Agent, or Firm* — Winston Hsu; Scott Margo

(57) ABSTRACT

An embodiment of the invention provides a telecommunications method performed by a second telecommunications device. According to the embodiment, the second telecommunications device first tries to use a received part of a data block to decode the data block, wherein the received part is received from a first telecommunications device. Next, the second telecommunications device determines whether a code metric derived based on the received part indicates that the data block is decodable. If the code metric indicates that the data block is decodable, the second telecommunications device further determines whether a set of confirmation criteria is satisfied.

20 Claims, 4 Drawing Sheets

TELECOMMUNICATIONS METHODS FOR INCREASING RELIABILITY OF EARLY TERMINATION OF TRANSMISSION

CROSS REFERENCE TO RELATED APPLICATIONS

The application claims the benefit of U.S. provisional application No. 61/653,627, filed on May 31, 2012 and incorporated herein by reference.

BACKGROUND

1. Technical Field

The invention relates generally to telecommunications, and more particularly, to telecommunications methods that increase the reliability of early termination of transmission.

2. Related Art

Telecommunications channels are frequently noisy and unreliable. As a result, if a first telecommunications device transmits M bits of data to a second telecommunications device without using any protection, where M is a positive integer, the second telecommunications device may fail to recover some of the M bits correctly.

To deal with this and other problems, the two telecommunications devices may use some methods to protect the data. For example, the first telecommunications device may encode the M bits of data into N bits of data that permits error correction, where N is a positive integer greater than M. Then, the first telecommunications device may transmit the N bits of data, rather than only the M bits of data, to the second telecommunications device. Even if the second telecommunications device recovers some of the N bits incorrectly, it may still decode the M bits of data accurately through error correction.

The N bits of data may be contained in a data block and correspond to a specific transmission time interval (TTI). For example, for speech data, the TTI may be 20 ms long and contain 30 slots; each of the slots may contain 2,560 chips. One of the first and second telecommunications devices may be a base station (BS) or a Node B while the other may be a mobile station (MS) or a piece of user equipment (UE). The aforementioned transmission may be uplink or downlink transmission.

As long as the second telecommunications device has at least P bits of the N bits of data correctly, where P is a positive integer equal to or greater than M and equal to or less than N, the second telecommunications device should be able to successfully decode the M bits of data. In other words, it's possible for the second telecommunications device to not receive the whole data block but still recover the M bits of data correctly. Therefore, if the second telecommunications device determines that it can decode the data contained in a data block not yet fully received, the second telecommunications device may disregard a remaining part (i.e. a not yet received part) of the data block. This may help the second telecommunications device save some energy and time. In addition, the second telecommunications device may transmit a positive early termination indicator (ETI) to the first telecommunications device, advising the first telecommunications device to not transmit a remaining part (i.e. a not yet transmitted part) of the data block. This may help the first telecommunications device to save energy and reduce interference to other second telecommunications devices.

SUMMARY

An embodiment of the invention provides a telecommunications method performed by a second telecommunications device. According to the embodiment, the second telecommunications device first tries to use a received part of a data block to decode the data block, wherein the received part is received from a first telecommunications device. Next, the second telecommunications device determines whether a code metric derived based on the received part indicates that the data block is decodable. If the code metric indicates that the data block is decodable, the second telecommunications device further determines whether a set of confirmation criteria is satisfied. If the code metric indicates that the data block is decodable and the set of confirmation criteria is satisfied, the second telecommunications device advises the first telecommunications device to not transmit an un-transmitted part of the data block to the second telecommunications device.

Another embodiment of the invention provides a telecommunications method performed by a second telecommunications device. According to the embodiment, the second telecommunications device first tries to use a received part of a data block to decode the data block, wherein the received part is received from a first telecommunications device. Next, the second telecommunications device determines whether a code metric derived based on the received part indicates that the data block is decodable. If the code metric indicates that the data block is decodable, the second telecommunications device further determines whether a set of confirmation criteria is satisfied.

Other features of the present invention will be apparent from the accompanying drawings and from the detailed description which follows.

BRIEF DESCRIPTION OF THE DRAWINGS

The invention is fully illustrated by the subsequent detailed description and the accompanying drawings, in which like references indicate similar elements.

DETAILED DESCRIPTION

There is likely a time lag between the timing when it's suitable for the second telecommunications device to suggest ET and the timing when the first telecommunications device actually detects the suggestion. For example, it takes some computation time for the second telecommunications device to determine whether ET of transmission is proper. Then, it takes some more time for a suggestion message to reach the first telecommunications device and for the first telecommunications device to detect the suggestion. For example, if the second telecommunications device may suggest ET after receiving J pieces of the data block, the first telecommunications device may detect the suggestion only after sending out J+K pieces of the data block, where both J and K are positive integers. As a result, the not yet received part and the not yet transmitted part mentioned above may be different from each other. Because time lag is almost ubiquitous, further discussion of it will be omitted hereinafter.

A potential risk of ET is that if the second telecommunications device suggests ET mistakenly, the first telecommunications device may stop transmitting pre-maturely and cause the second telecommunications device to be incapable of decoding the not fully transmitted data block. To deal with this and other potential risks, the second telecommunications device may need to act more carefully to increase the reliability of ET of transmission.

Figure 1:
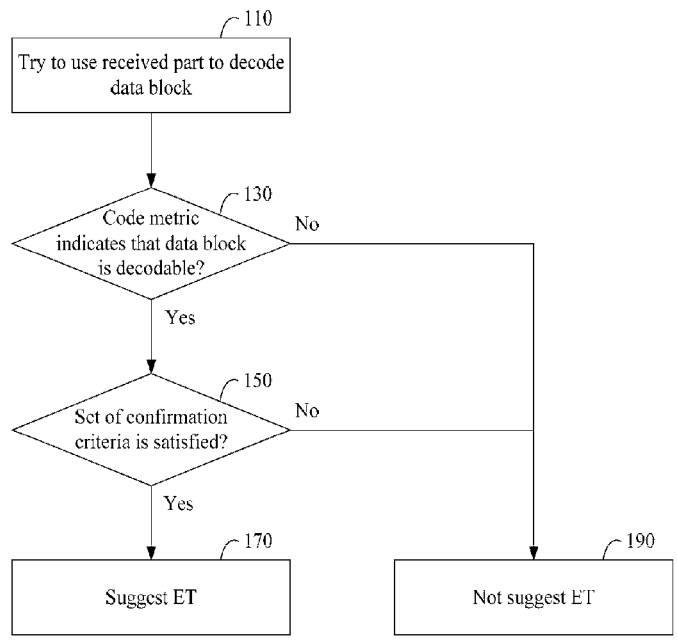
FIG. 1 shows a flowchart of a telecommunications method a second telecommunications device performs according to an embodiment of the invention.

FIG. 1 shows a flowchart of a telecommunications method that the second telecommunications device may perform according to an embodiment of the invention. First, at step 110, the second telecommunications device tries to use a received part of a data block to decode the data block. This step may be regarded as a decoding attempt, and the received part is a part of the data block that the second telecommunications device has already received from the first telecommunications device soon before this step. Because the second telecommunications device may have several decoding attempts while trying to receive the data block from the first telecommunications device, the second telecommunications device may perform the method several times while trying to receive the data block. Each time the second telecommunications device performs this method, the received part may be different.

The payload of the data block may be a unit for error correction. Because the second telecommunications device may need at least T pieces (each of which may be a slot) of the data block in order to decode successfully, the second telecommunications device needs not perform this method until T pieces of the data block are received, where T is a positive integer. After receiving T pieces of the data block and performing the method for the first time, the second telecommunications device may perform the method every time it has received Q more pieces of the data block from the first telecommunications device, where Q may be a positive integer. In other words, the second telecommunications device may perform the method after receiving T pieces of the data block, after receiving T+Q pieces of the data block, after receiving T+2Q pieces of the data block, and so on. As another example, the more pieces of the data block the received part contains, the second telecommunications device may perform this method more frequently. In other words, the value of Q may change over time. This is because the larger the received part is, the more feasible ET of transmission may be.

While performing step 110, the second telecommunications device may (e.g. use a decoder to) derive a code metric based on the received part of the data block. The code metric may indicate whether the data block is decodable with only the received part. For example, the code metric may be an error detection check value, such as a cyclic redundancy check (CRC) check value or a parity check value, derived based on the received part of the data block.

After the decoding attempt at step 110, steps 130 and 150 may help the second telecommunications device determine whether to enter step 170 or enter step 190. Specifically, at step 170, the second telecommunications device advises the first telecommunications device to not transmit an un-transmitted part of the data block because the second telecommunications device is certain that it has already acquired enough pieces of the data block and needs no more. In other words, the second telecommunications device suggests ET at step 170. On the other hand, at step 190, the second telecommunications device does not advise the first telecommunications device to not transmit the un-transmitted part of the data block because the second telecommunications device is uncertain as to whether it has acquired enough pieces of the data block. In other words, the second telecommunications device does not suggest ET at step 190. The un-transmitted part is a part of the data block that the first telecommunications device hasn't sent out yet. Because of time lag, the un-transmitted part mentioned in step 170/190 and the received part mentioned in step 110 may not piece up the whole data block.

There are several ways for the second telecommunications device to perform step 170 and 190. For example, the second telecommunications device may either transmit an acknowledgement (ACK) message to the first telecommunications device at step 170 or transmit a negative acknowledgement (NACK) message to the first telecommunications device at step 190. As another example, the second telecommunications device may either transmit an ACK message to the first telecommunications device at step 170 or refrain from transmitting any ET-related message (e.g. ACK or NACK) to the first telecommunications device at step 190. In these two examples, an ACK message may be regarded as a positive ETI, while a NACK message may be regarded as a negative ETI.

As mentioned, steps 130 and 150 may help the second telecommunications device determine whether to enter step 170 or 190. First, at step 130, the second telecommunications device determines whether the code metric derived based on the received part of the data block indicates that the data block is decodable with only the received part. If the answer is yes, the second telecommunications device enters step 150; otherwise, it enters step 190.

In the real world, code metrics are not completely reliable. When a code metric derived based on a received part of a data block indicates that the data block is decodable, the reality sometimes may be the opposite. Therefore, it may not be the best practice for the second telecommunications device to enter step 170 merely because the code metric indicates that the data block is decodable. To increase the reliability of ET of transmission, the method further includes step 150 that allows the second telecommunications device to seek additional assurance before entering step 170.

At step 150, the second telecommunications device further determines whether a set of confirmation criteria is satisfied. If the set of confirmation criteria is satisfied, the first telecommunications device enters step 170; otherwise, it enters step 190. As used herein, a set of criteria may include only one criterion or a plurality of criteria. If the set of confirmation criteria includes a plurality of criteria, the second telecommunications device may check the criteria in sequence (e.g. one after another), or check the criteria in a mixed way (e.g. all at once). Everything else remains the same, when a confirmation criterion is satisfied, the second telecommunications device may be more confident in suggesting ET by entering step 170.

FIG. 2 to FIG. 7 show several exemplary scenarios illustrating how the method of FIG. 1 may actually be performed several times while the second telecommunications device is trying to receive a data block from the first telecommunications device. These exemplary scenarios are drawn from the second telecommunications device's perspective. In these exemplary scenarios, a data block corresponds to a TTI that is 20 ms long and contains 30 slots. Each of the slots contains 2,560 chips. The following paragraphs will use these exemplary scenarios to help explain some exemplary details of the method depicted in FIG. 1.

As mentioned above, the set of confirmation criteria may include only one criterion or a plurality of criteria. One exemplary criterion of the set of confirmation criteria is that the second telecommunications device has derived at least a threshold amount (e.g. X) of code metrics indicating that the data block is decodable, where X may be a positive integer. For example, the second telecommunications device may have performed the method of FIG. 1 for the data block Y times, where Y is a positive integer equal to or greater than X.

Because each time the second telecommunications device performs step 110, it may derive a code metric indicating whether the data block is already decodable, the second telecommunications device may have already derived Y code metrics. Among the Y code metrics, X code metrics of them indicate that the data block is already decodable. In other words, in X of the Y times of performing the method of FIG. 1, the second telecommunications device enters step 150 from step 130 This means that the second telecommunications device may have acquired enough assurance that ET of transmission is feasible.

Generally speaking, because the more pieces of the data block the second telecommunications device has, the more confident the second telecommunications device may be in suggesting ET. Therefore, the second telecommunications device may gradually reduce the strictness of the aforementioned confirmation criterion, e.g. by making the strictness negatively correlated with the amount of slots of the data block that are already received. In other words, X may have the highest value when the second telecommunications device has just begun receiving the data block. Then, each time the second telecommunications device performs the method, the second telecommunications device may maintain or reduce the strictness of the confirmation criterion by maintaining or reducing the value of X, making the confirmation criterion equally or more easily to be satisfied. This additional step of controlling the strictness of the confirmation criterion may be performed before step 150.

Figure 2:
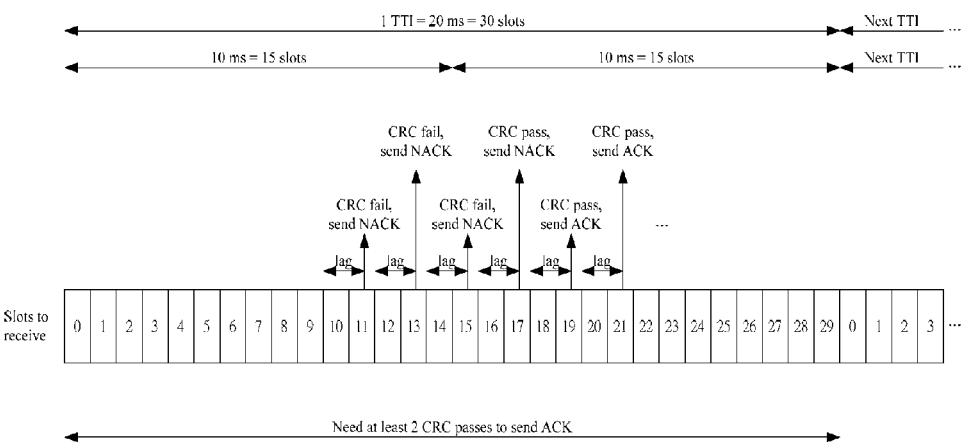
FIG. 2 to FIG. 7 shows several exemplary scenarios illustrating how the method of FIG. 1 may actually be performed while the second telecommunications device is trying to receive a data block from a first telecommunications device.
Figure 3:
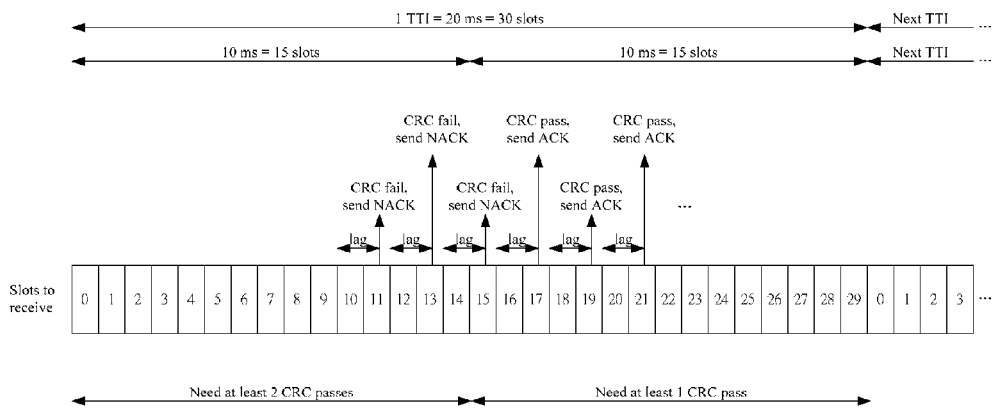

The exemplary scenario shown in FIG. 2 and FIG. 3 may help explain what's discussed in the previous two paragraphs. In each of these scenarios, the second telecommunications device has decoding attempts after receiving 10 slots, 12 slots, 14 slots, and 16 slots . . . of the data block, respectively, and performs the method of FIG. 1 once for each of these decoding attempts. Furthermore, in each of these scenarios, the second telecommunications device gets a code metric indicating that the data block is still not decodable at each of the first three decoding attempts. For example, at each of the first three decoding attempts, the second telecommunications device has a CRC fail. Then, at each of the subsequent decoding attempts, the second telecommunications device gets a code metric indicating that the data block is already decodable. For example, at each of these subsequent decoding attempts, the second telecommunications device has a CRC pass. In the scenario shown in FIG. 2, the value of X is fixed to two, and the second telecommunications device sends out an ACK after each of the fifth and subsequent decoding attempts. In the scenario shown in FIG. 3, the value of X is originally two and then reduced to one, and the second telecommunications device sends out an ACK after each of the fourth and subsequent decoding attempts.

Another exemplary criterion of the set of confirmation criteria is that the second telecommunications device has derived a communications quality indicator CQI greater than a communications quality threshold CQT. To name a few examples, the CQI may be a signal to noise ratio (SNR) or a signal to interference and noise ratio (SINR). The second telecommunications device may calculate the CQI for the period during which the second telecommunications device receives the received part the data block. For example, if the received part contains the first 16 slots of the data block, the second telecommunications device may calculate the CQI for the period during which it receives the first 16 slots of the data block from the first telecommunications device.

The threshold CQT may have a fixed value or change over time. For example, the second telecommunications device may gradually reduce the strictness of the aforementioned confirmation criterion, e.g. by making the strictness negatively correlated with the amount of slots of the data block that are already received. In other words, CQT may have the highest value when the second telecommunications device has just begun receiving the data block. Then, each time the second telecommunications device performs the method, the second telecommunications device may maintain or reduce the strictness of the confirmation criterion by maintaining or reducing the value of CQT, making the confirmation criterion equally or more easily to be satisfied. This additional step of controlling the strictness of the confirmation criterion may be performed before step 150.

Figure 4:
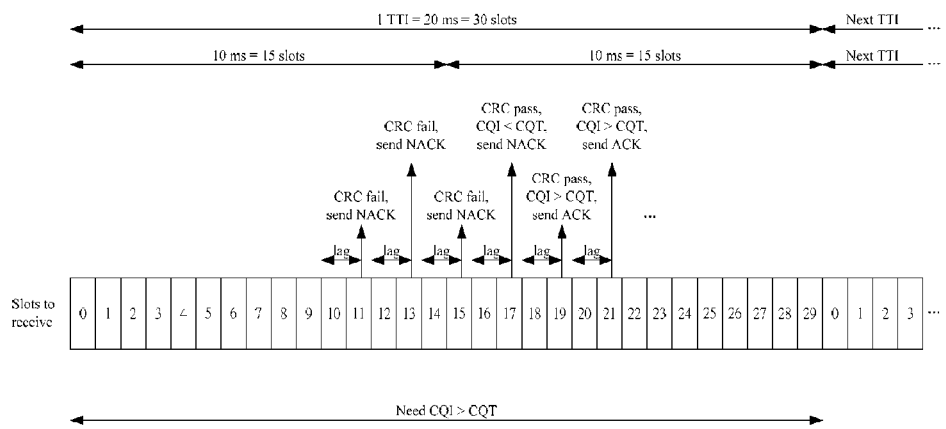
Figure 5:
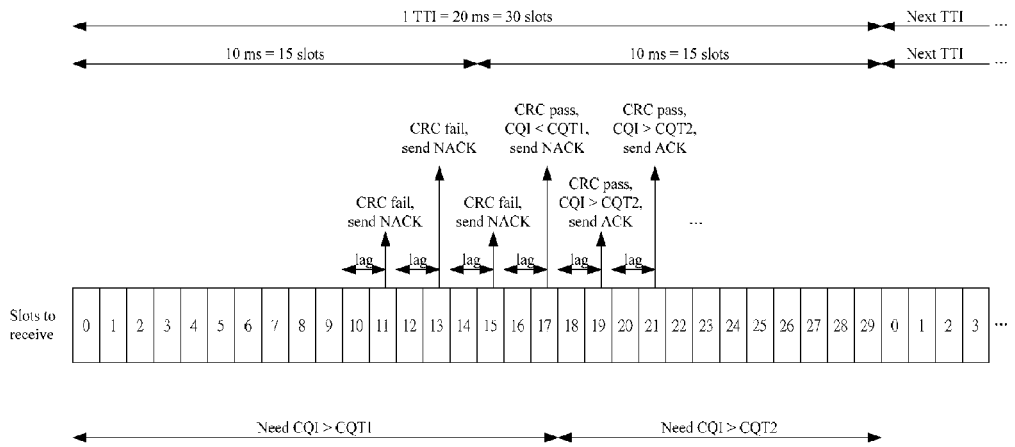

The exemplary scenario shown in FIG. 4 and FIG. 5 may help explain what's discussed in the previous two paragraphs. In each of these two scenarios, the second telecommunications device has decoding attempts after receiving 10 slots, 12 slots, 14 slots, and 16 slots . . . of the data block, respectively, and performs the method of FIG. 1 once for each of these decoding attempts. Furthermore, at each of the first three attempts, the second telecommunications device has a CRC fail. Then, at each of the subsequent decoding attempts, the second telecommunications device has a CRC pass. In the scenario shown in FIG. 4, the value of CQT is fixed, and the second telecommunications device sends out an ACK after each of the fifth and subsequent decoding attempts. In the scenario shown in FIG. 5, the value of CQT is originally CQT1 and then reduced to CQT2, and the second telecommunications device sends out ACK after each of the fifth and subsequent decoding attempts. For example, if CQT2 is equal to zero, it means that there is no CQI requirement after 18 slots are received.

Another exemplary criterion of the set of confirmation criteria is that the second telecommunications device has derived a decoding quality indicator DQI greater than a decoding quality threshold DQT. For example, if the second telecommunications device uses a Viterbi decoder, the second telecommunications device may derive the indicator DQI based on the maximum likelihood (ML) parameter(s) of the most likely code word(s) (e.g. the most likely and second most likely code words). As another example, the second telecommunications device may extract soft or hard correlation metric(s) from its decoder and then uses the extracted metric(s) to derive the indicator DQI. Just like the previous examples, the threshold DQT may have a fixed value or change over time.

Figure 6:
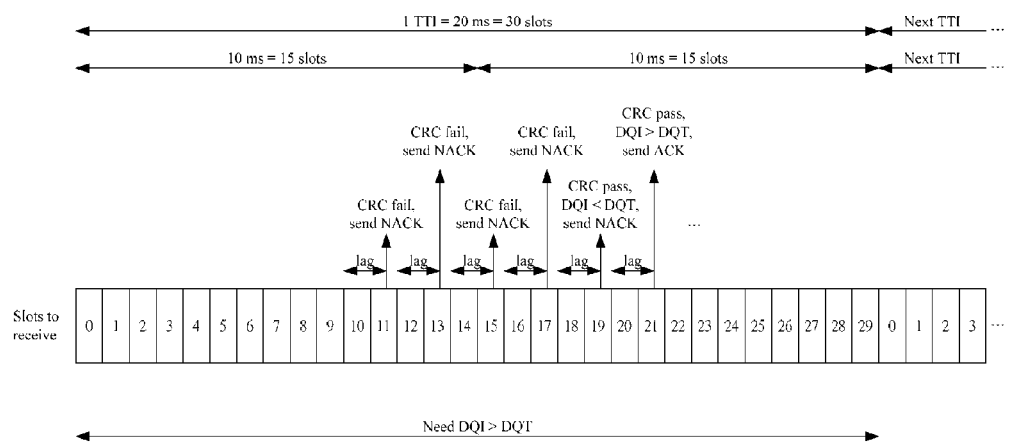
Figure 7:
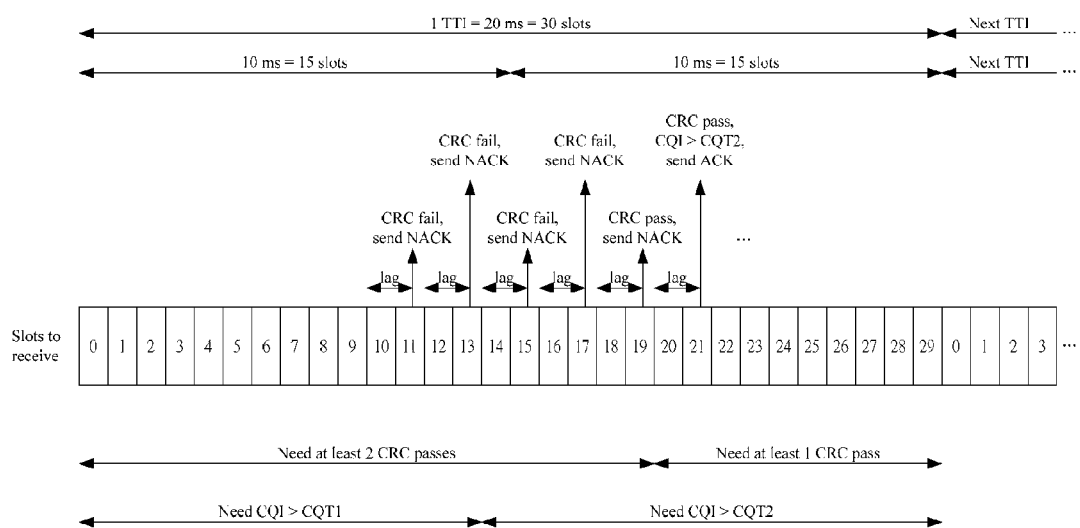

The exemplary scenario shown in FIG. 6 may help explain what's discussed in the previous paragraph. In the scenario, the second telecommunications device has decoding attempts after receiving 10 slots, 12 slots, 14 slots, and 16 slots . . . of the data block, respectively, and performs the method of FIG. 1 once for each of these decoding attempts. Furthermore, at each of the first four decoding attempts, the second telecommunications device has a CRC fail. Then, at each of the subsequent decoding attempts, the second telecommunications device has a CRC pass. In this scenario, the value of DQT is fixed, and the second telecommunications device sends out an ACK after each of the sixth and subsequent decoding attempts. In another example, the value of DQT may change over time.

The set of confirmation criteria used at step 150 may include any of the aforementioned exemplary criteria and any other not mentioned ones. For example, in the scenario shown in FIG. 7, the set of confirmation criteria include a CQI related criterion and a CRC count related criterion. Moreover, each of these criteria has two different levels of strictness. In the scenario, the second telecommunications device has decoding attempts after receiving 10 slots, 12 slots, 14 slots, and 16 slots . . . of the data block, respectively, and performs the method of FIG. 1 once for each of these decoding attempts. Furthermore, at each of the first four attempts, the second telecommunications device has a CRC fail. Then, at each of the subsequent decoding attempts, the second telecommunications device has a CRC pass. After the sixth decoding attempt, the second telecommunications device gets a CRC pass and finds that the two confirmation criteria are satisfied, and then sends an ACK message to the first telecommunications device.

The aforementioned examples may help the first telecommunications device and the second telecommunications device to increase the reliability of ET of transmission. As mentioned above, proper performance of ET of transmission may help the first telecommunications device and the second telecommunications device to save energy or time. This is a great advantage, especially when at least one of the two devices is a portable device powered by a battery. In addition, proper performance of ET of transmission may help reduce interference within the telecommunications system that the first and second telecommunications devices belong to.

In the foregoing detailed description, the invention has been described with reference to specific exemplary embodiments thereof. It will be evident that various modifications may be made thereto without departing from the spirit and scope of the invention as set forth in the following claims. The detailed description and drawings are, accordingly, to be regarded in an illustrative sense rather than a restrictive sense.

What is claimed is:

1. A telecommunications method performed by a second telecommunications device, the method comprising:
    trying to use a received part of a data block to decode the data block, wherein the received part is received from a first telecommunications device;
    determining whether a code metric derived based on the received part indicates that the data block is decodable;
    if the code metric indicates that the data block is decodable, further determining whether a set of confirmation criteria is satisfied; and
    if the code metric indicates that the data block is decodable and the set of confirmation criteria is satisfied, advising the first telecommunications device to not transmit an un-transmitted part of the data block to the second telecommunications device.

2. The method of claim 1, wherein the code metric comprises:
    an error detection check value derived based on the received part of the data block.

3. The method of claim 2, wherein the error detection check value is a cyclic redundancy check (CRC) check value.

4. The method of claim 2, wherein the error detection check value is a parity check value.

5. The method of claim 1, wherein the set of confirmation criteria comprises:
    a communications quality indicator is greater than a threshold.

6. The method of claim 5, wherein the communications quality indicator is a signal to noise ratio (SNR) calculated for a period during which the second telecommunications device receives the received part of the data block.

7. The method of claim 5, wherein the communications quality indicator is a signal to interference and noise ratio (SINR) calculated for a period during which the second telecommunications device receives the received part of the data block.

8. The method of claim 1, wherein the set of confirmation criteria comprises:
    a decoding quality indicator is greater than a threshold.

9. The method of claim 8, wherein the decoding quality indicator is derived based on at least one maximum likelihood parameter associated with the received part of the data block.

10. The method of claim 8, wherein the decoding quality indicator is derived based on at least one soft correlation metric associated with the received part of the data block.

11. The method of claim 8, wherein the decoding quality indicator is derived based on at least one hard correlation metric associated with the received part of the data block.

12. The method of claim 1, wherein the set of confirmation criteria comprises:
    the second telecommunications device has derived at least a threshold amount of code metrics indicating that the data block is decodable.

13. The method of claim 1, further comprising:
    maintaining or reducing the strictness of at least one confirmation criterion of the set of confirmation criteria.

14. A telecommunications method performed by a second telecommunications device, the method comprising:
    trying to use a received part of a data block to decode the data block, wherein the received part is received from a first telecommunications device;
    determining whether a code metric derived based on the received part indicates that the data block is decodable; and
    if the code metric indicates that the data block is decodable, further determining whether a set of confirmation criteria is satisfied.

15. The method of claim 14, wherein the code metric comprises:
    an error detection check value derived based on the received part of the data block.

16. The method of claim 14, wherein the set of confirmation criteria comprises:
    a communications quality indicator is greater than a threshold.

17. The method of claim 14, wherein the set of confirmation criteria comprises:
    a decoding quality indicator is greater than a threshold.

18. The method of claim 14, wherein the set of confirmation criteria comprises:
    the second telecommunications device has derived at least a threshold amount of code metrics indicating that the data block is decodable.

19. The method of claim 14, further comprising:
    maintaining or reducing the strictness of at least one confirmation criterion of the set of confirmation criteria.

20. The method of claim 14, further comprising:
    if the code metric indicates that the data block is decodable and the set of confirmation criteria is satisfied, sending a positive early termination indicator to the first telecommunications device to advise the first telecommunications device to not transmit an un-transmitted part of the data block to the second telecommunications device.

* * * * *